United States Patent
Ebefors et al.

(10) Patent No.: US 9,224,681 B2
(45) Date of Patent: Dec. 29, 2015

(54) CTE MATCHED INTERPOSER AND METHOD OF MAKING

(71) Applicants: Thorbjorn Ebefors, Huddinge (SE); Daniel Perttu, Hasselby (SE)

(72) Inventors: Thorbjorn Ebefors, Huddinge (SE); Daniel Perttu, Hasselby (SE)

(73) Assignee: SILEX MICROSYSTEMS AB, Jarfalla (SE)

(*) Notice: Subject to any disclaimer, the term of this patent is extended or adjusted under 35 U.S.C. 154(b) by 0 days.

(21) Appl. No.: 14/391,855

(22) PCT Filed: Apr. 15, 2013

(86) PCT No.: PCT/SE2013/050408
§ 371 (c)(1),
(2) Date: Oct. 10, 2014

(87) PCT Pub. No.: WO2013/154497
PCT Pub. Date: Oct. 17, 2013

(65) Prior Publication Data
US 2015/0076677 A1  Mar. 19, 2015

(30) Foreign Application Priority Data
Apr. 13, 2012 (SE) .................................... 1250374

(51) Int. Cl.
*H01L 23/498* (2006.01)
*H01L 23/31* (2006.01)
(Continued)

(52) U.S. Cl.
CPC ........ *H01L 23/49838* (2013.01); *H01L 21/486* (2013.01); *H01L 23/147* (2013.01);
(Continued)

(58) Field of Classification Search
CPC ............ H01L 23/481; H01L 21/76898; H01L 23/49827; H01L 2224/1308; H01L 25/0657; H01L 25/50; H01L 24/11
See application file for complete search history.

(56) References Cited

U.S. PATENT DOCUMENTS 6,335,491 B1  1/2002  Alagaratnam et al.
7,298,043 B2*  11/2007  Yui ............................... 257/713
(Continued)

FOREIGN PATENT DOCUMENTS

EP  2 165 362 B1  3/2010
JP  2010225955 A  10/2010
(Continued)

OTHER PUBLICATIONS

International Search Report, dated Oct. 3, 2013, from corresponding PCT application.

*Primary Examiner* — Roy Potter
(74) *Attorney, Agent, or Firm* — Young & Thompson

(57) ABSTRACT

The present interposer makes it possible to tailor the coefficient of thermal expansion of the interposer to match components to be attached thereto within very wide ranges. The semiconductor interposer, includes a substrate of a semiconductor material having a first side and an opposite second side. There is at least one conductive wafer-through via including metal. At least one recess is provided in the first side of the substrate and in the semiconductor material of the substrate, the recess being filled with metal and connected with the wafer-through via providing a routing structure. The exposed surfaces of the metal-filled via and metal-filled recess are essentially flush with the substrate surface on the first side of the substrate. The wafer-through via includes a narrow part and a wider part, and contact elements are provided on the routing structure having an aspect ratio, height: diameter, <1:1, preferably 1:1 to 2:1.

18 Claims, 11 Drawing Sheets

(51) Int. Cl.
*H01L 21/48* (2006.01)
*H01L 23/14* (2006.01)

(52) U.S. Cl.
CPC ...... *H01L23/3142* (2013.01); *H01L 23/49811* (2013.01); *H01L 23/49816* (2013.01); *H01L 23/49827* (2013.01); *H01L 2224/16* (2013.01); *H01L 2924/1461* (2013.01)

(56) References Cited

U.S. PATENT DOCUMENTS

| 7,667,473 | B1 * | 2/2010 | Conn et al. | 324/750.3 |
|---|---|---|---|---|
| 2003/0222350 | A1 * | 12/2003 | Sawada | 257/758 |
| 2009/0243100 | A1 | 10/2009 | Akiyama | |
| 2009/0321911 | A1 * | 12/2009 | Son | 257/686 |
| 2014/0035935 | A1 * | 2/2014 | Shenoy et al. | 345/501 |

FOREIGN PATENT DOCUMENTS

| KR | 20090120167 A | 11/2009 |
|---|---|---|
| WO | 2010059118 A1 | 5/2010 |
| WO | 2013/137809 A1 | 3/2013 |
| WO | 2013/147694 A1 | 10/2013 |

* cited by examiner

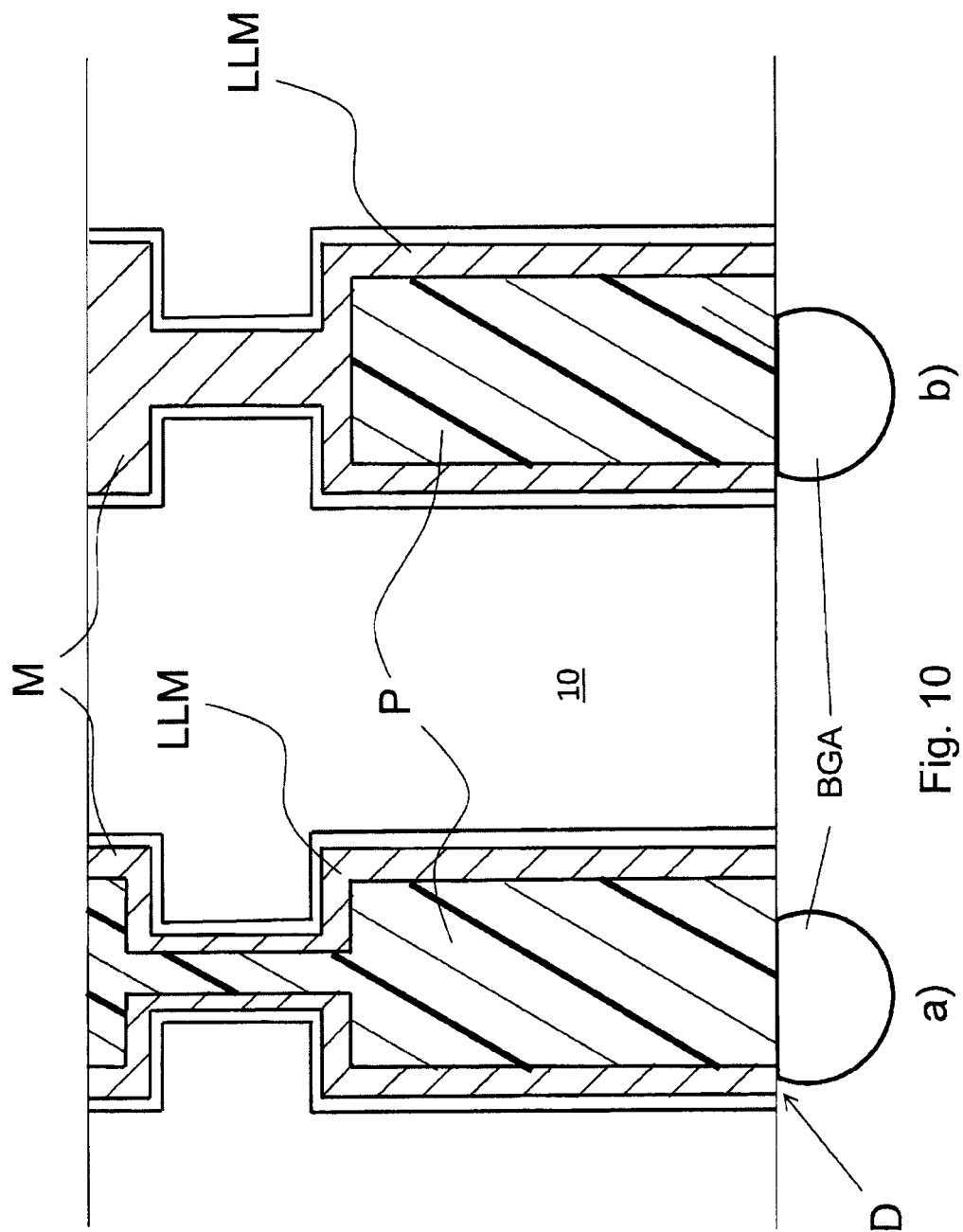

CTE MATCHED INTERPOSER AND METHOD OF MAKING

The present invention relates to semiconductor packaging In particular it relates to an interposer with matched coefficient of thermal expansion (CTE).

BACKGROUND OF THE INVENTION

In modern electronic devices such as mobile phones, computers etc. there is a continuous strive for miniaturization and close-packing of components. In the continuous strive of making micro components more densely packed, problems are encountered in particular where wafer through structures (also referred to as vias) are provided in very close proximity to each other. In particular where the vias are made from a material that is different from the substrate material in which they are provided, e.g. metal and silicon in the vias and substrate respectively, different thermal expansion effects may lead to substrates being subject to cracking and breaking during manufacturing, or other reliability issues during use.

Among other things it is desirable to be able to stack chips carrying various devices on top of each other, so called interposers. Also, it is desirable to be able to provide so called redistribution layers or routing structures for signals coming from integrated circuits having large numbers of I/O contacts. Such contacts can be as many as several thousand on a chip of a size of the order of 10 mm square. If the signals are to be routed through the substrate, the through-substrate connections (vias) would have to be equally closely spaced. When such vias are made of metal and very closely spaced, thermal expansion effects due to different coefficients of expansion may cause damage to the very thin and brittle chips in which they are made. This frequently occurs both during processing but also in use in the end product, if it is subjected to temperature changes over large intervals. Also, the thickness of the substrate for such vias would have to be in the order of 100 μm, which is extremely.

Thus, in modern electronic devices such as mobile phones, the different thermal expansion coefficients for the various materials in the housing, the circuit boards, and the micro chips (MEMS, CMOS and the like), respectively, inevitably will cause problems unless relevant design measures are taken.

It is not suitable to provide routing by vias directly from each I/O point on a IC chip through the substrate on which the chip is mounted. Instead one provides for the above mentioned redistribution structures on the surface of the substrate on which the chip is mounted. The routings are "fanned out", i.e. the individual conductive strips diverge from the I/O points to a more widely spaced structure, where vias for routing through the substrate are provided.

However, even with such precautions there will be a tendency for thermal stress in the interface between the I/O points and the substrate. To alleviate this effect a conventional procedure is to provide so called "underfill" in the very small space between the substrate and IC chip, using capillary forces. However, this requires that the vias are completely filled to be hermetically sealed such that there will be no leakage of underfill between the stacked structures, which could lead to improper underfill, degradation of the final product, reliability issues and packing issues, rendering final product useless.

Thus, it is desirable to provide filled vias. However, filling conventional vias with metal again will bring the thermal expansion effects into play, in particular if they were to be provided directly beneath the IC chip.

Also, as mentioned above, from a processing point of view, the thickness of the substrate normally cannot be as small as 100 μm without the use of carriers, but rather 300 μm and more is more reasonable not requiring carriers. However, for 300 μm thick wafers it is difficult not to say impossible to make void free hermetically tight vias of the size desirable, e.g. 15-100 μm in diameter, that extend through the substrate, in a cost efficient manner, i.e. in volume production.

No suitable conductive metal for making TSVs that has CTE that matches the Silicon is known at present.

PRIOR ART

In FIG. 1 there is shown a prior art structure disclosed in applicants own WO 2007/089206 A1. Here, routing from a via to a contact pad on a remote location on the substrate is provided by a two-step etching process, wherein via holes are first made, and then recesses are made in a subsequent step. These routing structures will be in-plane and the vias are filled. Thermal expansion issues may occur if high density TSVs are to be used.

In FIG. 2 another prior art via structure is shown, details of which are disclosed in applicants own WO 2010/059118. This via structure comprises a wide and deep part extending form one side of the wafer, and a shallow and narrow part extending from the other side. When the via is metallized, only the walls of the wide part is covered (referred to as a "liner via") whereas the narrow part is completely filled. This structure is advantageous in that thermal effects due to different expansion properties of metal and silicon will not have a major influence despite close-packing of the vias. It also requires less process time with regards to Electrochemical deposition (ECD) of metal (e.g. Cu).

When routing layers are provided on a structure as the one above, a disadvantage is that it results in topography.

In EP-2 165 362 (ÅAC Microtec AB) a process referred to as the XiVia™ process is disclosed. In this process KOH etching is used and when it is scaled to higher densities (i.e. smaller holes with larger aspect ratios), the KOH yields a sloping surface that will occupy to much area to make higher densities possible.

When integrated circuits are to be mounted on traditional circuit boards, the differences in thermal expansion due to environmental influence and other factors come into play. In fact, devices can be broken during use due to forces occurring during thermal expansion.

FIG. 3 is a schematic cross-section showing different values of CTE in a stack of components (a so called "CTE pyramid for interposers"), and FIG. 4 schematically shows an example of a prior art solution to the problem of temperature matching of components with large differences in CTE.

Thus, on top of the stacked structure shown in FIG. 3-4 there is one or more integrated circuits IC, e.g. ASICs or other components, with high density I/O:s and a CTE of about 3 ppm/C. These components are attached to a silicon or glass interposer IP which a CTE of 5-8 ppm/C. At the bottom of the stack there is a Module/Processor PCB having a high CTE of about 18-22 ppm/C. In order to match the CTEs one has to provide a BGA (Ball Grid Array) substrate having a CTE of about 12-17 PPM/C between the PCB and the glass/silicon interposer.

Furthermore, in order to provide enhanced CTE matching there is provided so called underfill between on one hand the IC component and the interposer, and on the other between the PCB and the BGA substrate.

This underfill is applied as a liquid that is drawn into the very small spacing by capillary force.

This structure is fairly complicated to handle since the interposer and the BGA substrate are very thin. Thus, it would be desirable to have an interposer structure that both provides the required CTE matching and ease of handling.

SUMMARY OF THE INVENTION

In view of the demands mentioned above and the shortcomings of the state of the art technology, the inventors have devised a new interposer which overcome the problem of the prior art relating to the complexity of the structures required for CTE matching.

An interposer according to the invention is defined in claim 1.

The benefit of using a rigid interposer is i.a. an ability to create TSVs through full wafer thickness. The stress gradient across a thick interposer is reduced, and it can be directly attached to the PCB and will accommodate stresses.

Also, rigid interposers best take advantage of existing wafer processing, and there is no need for complex thin wafer handling.

The inventive merit of the present interposer is that it is possible to taylor the coefficient of thermal expansion CTE of the interposer to match components to be attached thereto within very wide ranges.

The invention eliminates organic substrates which improves heat transfer, thermal matching of die to package. A silicon substrate can furthermore be "functionalized" by incorporating passive (resistances, capacitances, inductances) or active elements (e.g. diodes and ESD protection), which is not possible with organic substrates.

A further advantage is a more cost efficient structure, in that only one substrate is needed.

In another aspect there is provided a method of making an interposer, defined in claim 18. The method comprises providing a substrate having a front side and a back side; making a double via having a narrow part and a wide part; depositing metal at least as a liner layer inside the via on its walls; providing redistribution structures in the surface(s) of the substrate which are flush with at least the front side of the substrate; making contact elements on the redistribution structures on the front side, said contact elements having an aspect ratio, height:diameter <1:1, preferably 1:1 to 2:1.

BRIEF DESCRIPTION OF THE DRAWINGS

Further scope of applicability of the present invention will become apparent from the detailed description given hereinafter and the accompanying drawings which are given by way of illustration only, and thus not to be considered limiting on the present invention, and wherein.

DETAILED DESCRIPTION OF PREFERRED EMBODIMENTS

Herein wafers are disclosed with hermetically sealed and close-packed vias and with in-plane routing patterns, such that the advantages of both of the above described prior art structures are combined in one structure.

Figure 1:
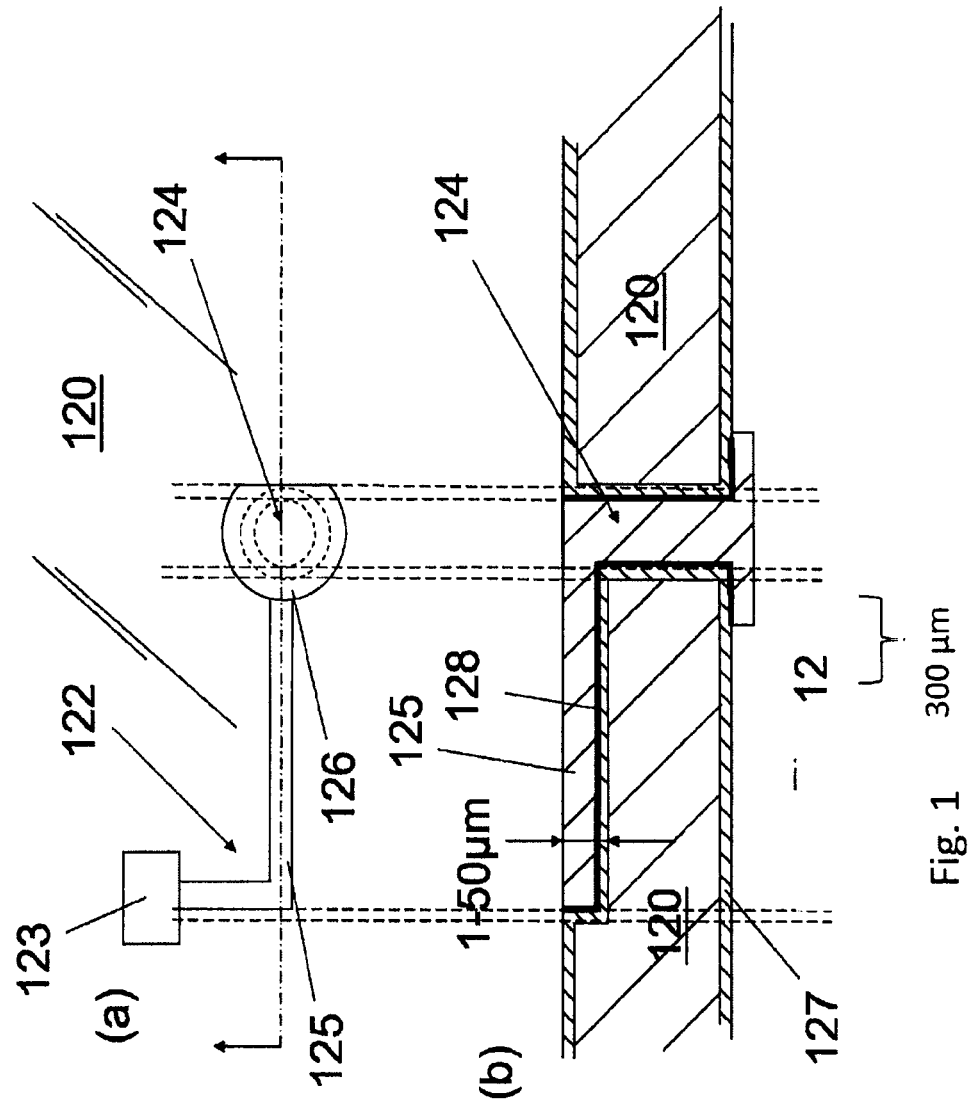
FIG. 1 shows a prior art structure with a filled via wherein the routing from a via is in-plane.

The prior art structure according to FIG. 1 comprises a conventional metal via, where the diameter is in the order of 300 µm. This structure is fairly easy to manufacture as long as the pitch, i.e. center-to-center distance between vias is not too small. Density of vias is of course also important. For a "fully propagated" wafer wherein the pitch is in the range of twice the diameter of the vias thermal stress effects may easily cause damage to the substrate, both during manufacture and use.

Consequently, if it is desired to provide more closely packed via structures the diameter of the via holes must be reduced. However, for small diameters it becomes very difficult with common prior art technologies like PVD to provide the seed layer in the holes for subsequent plating, and in particular to provide a conformal seed layer, if the aspect ratio (Depth/Width) is high, i.e. is more than 2:1, and even for aspect ratios down to 1:1 it may be difficult, due to the nature of the PVD process and step coverage. The seed layer on the field (i.e. the flat wafer area surrounding the vias and the RDL structures) where the RDL are to be made needs to be thick and therefore makes densely packed redistribution wires with small feature size difficult to obtain, when the seed layer is to be removed by wet etching processes.

Figure 2:
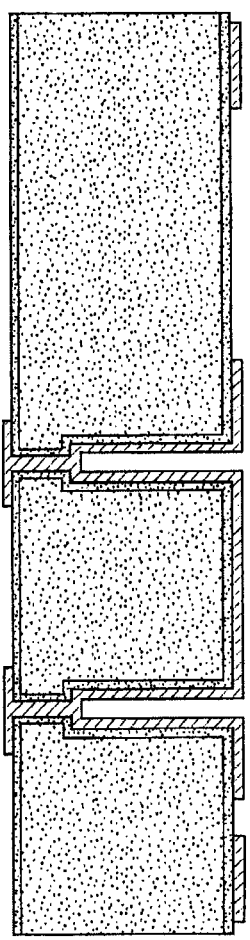
FIG. 2 illustrates a prior art via comprising a wide part and a narrow part wherein only the narrow part is filled with metal.
Figure 3:
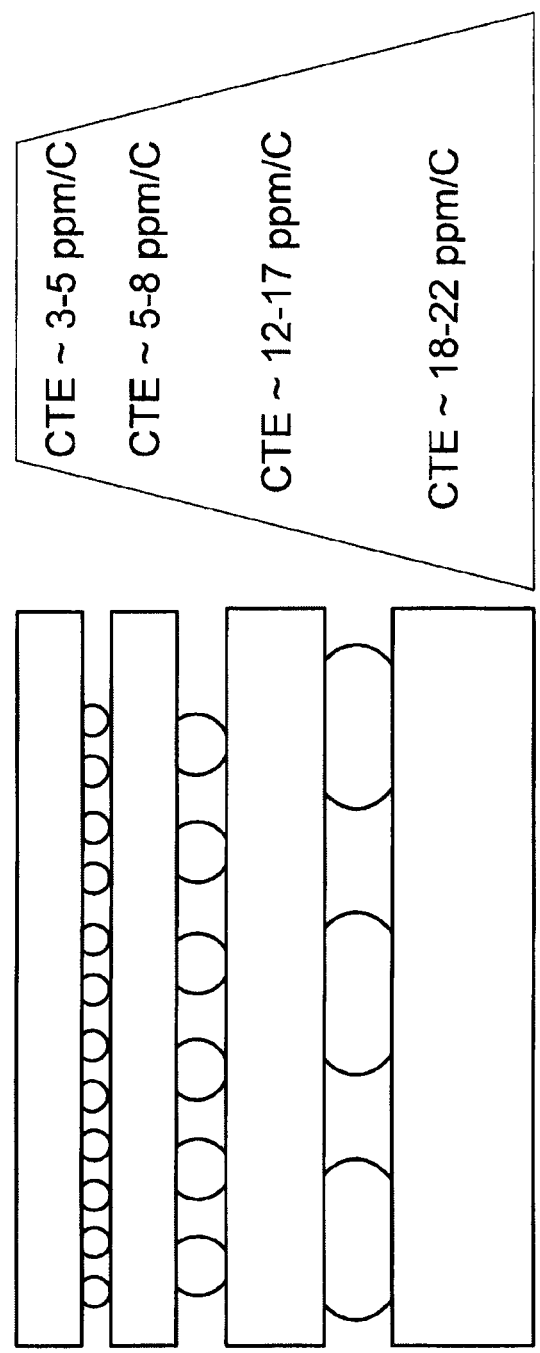
FIG. 3 is an illustration of a so called reliability pyramid, showing temperature matching requirements.

This problem is solved by using methods disclosed in co-pending international applications PCT/SE2013/050225 and PCT/SE2013/050353, both assigned to the same assignee as in the present application The structure according to FIG. 2 is very flexible/adaptable in terms of the amount of metal that can be introduced in it. In the embodiment shown in the figures, especially the final structure in FIG. 6, it is seen that the top portion is filled with metal, whereas the bottom portion has only the walls thereof coated, as a "liner" of metal. By making this liner thicker or thinner, the temperature expansion properties can be varied to adapt to components to be attached to the interposer, primarily by virtue of there being air present in the via, which renders it able to accommodate movements. Instead letting air being present other materials can be provided, which is described further below.

Interposers in general are used for connecting devices having high density I/Os with devices having low density I/Os. Normally, matching of devices having different CTE is made by using a so called underfill, which is a material that is applied in the very small spacing between a device having one CTE and another device having a differing CTE.

The inventive merit of the present interposer is that it is possible to taylor the coefficient of thermal expansion CTE of the interposer to match components to be attached thereto within very wide ranges.

The invention essentially resides in the adaption of the CTE of the interposer to the extremes in CTE represented by the silicon die on one side of the interposer and the plastic or ceramic circuit board on the other side of the interposer. The CTE of the interposer is thereby selected to be somewhere in between these extremes, which prevents undue strain and stress that the interposer otherwise might be subjected to.

There are several ways to achieve this result.

One way is to select the width of the via holes according to the situation, where wider vias (i.e. more metal) will increase the CTE and narrower vias will reduce the CTE. Of course the routing structures can also be made to exhibit primarily larger depth. The width would normally be required to be small because of the need to close-pack the structures.

Another method is to provide thermal expansion matching structures, i.e. non-functional vias and/or recesses. Thereby the width and depth of the recesses and vias can be taylored to the situation at hand, and also the density of structures can be increased if required.

Figure 4:
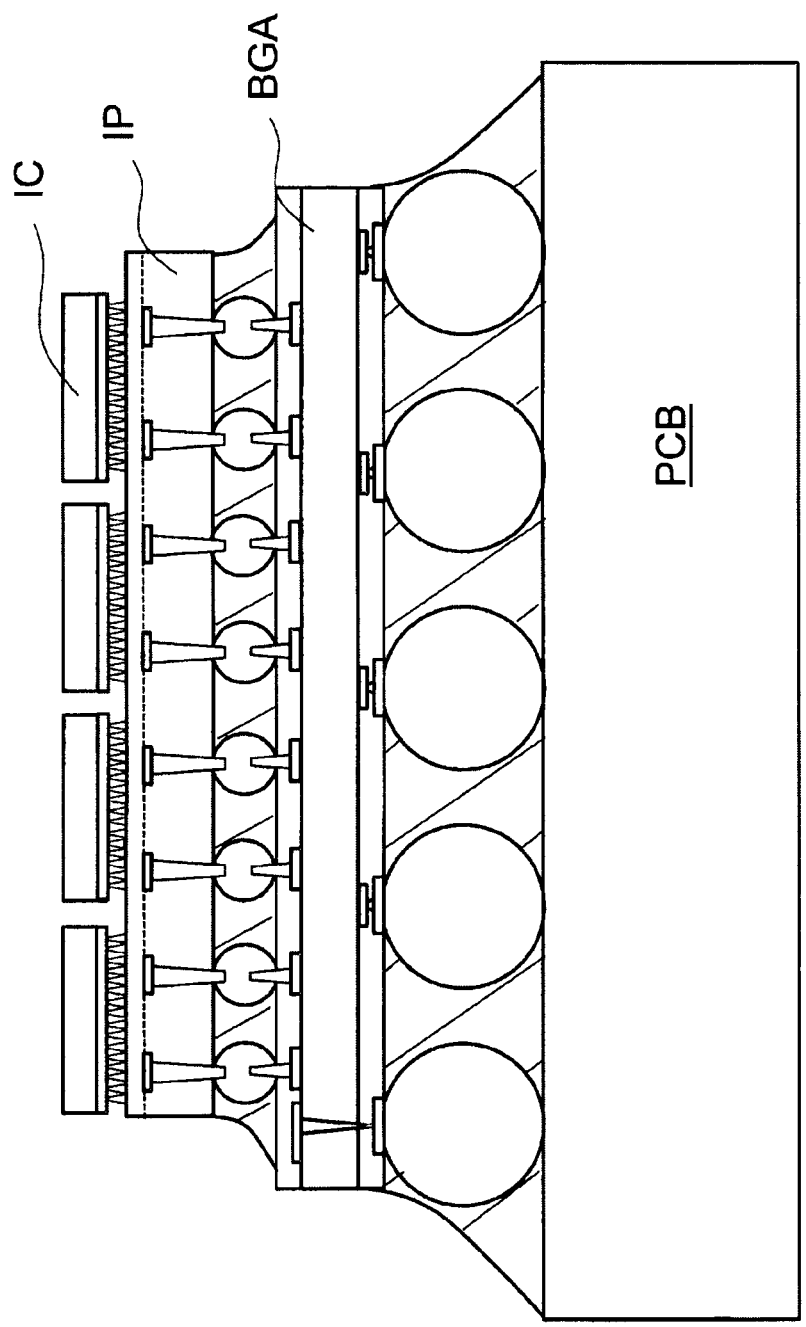
FIG. 4 is a schematic illustration of a prior art CTE matched interposer structure.
Figure 5:
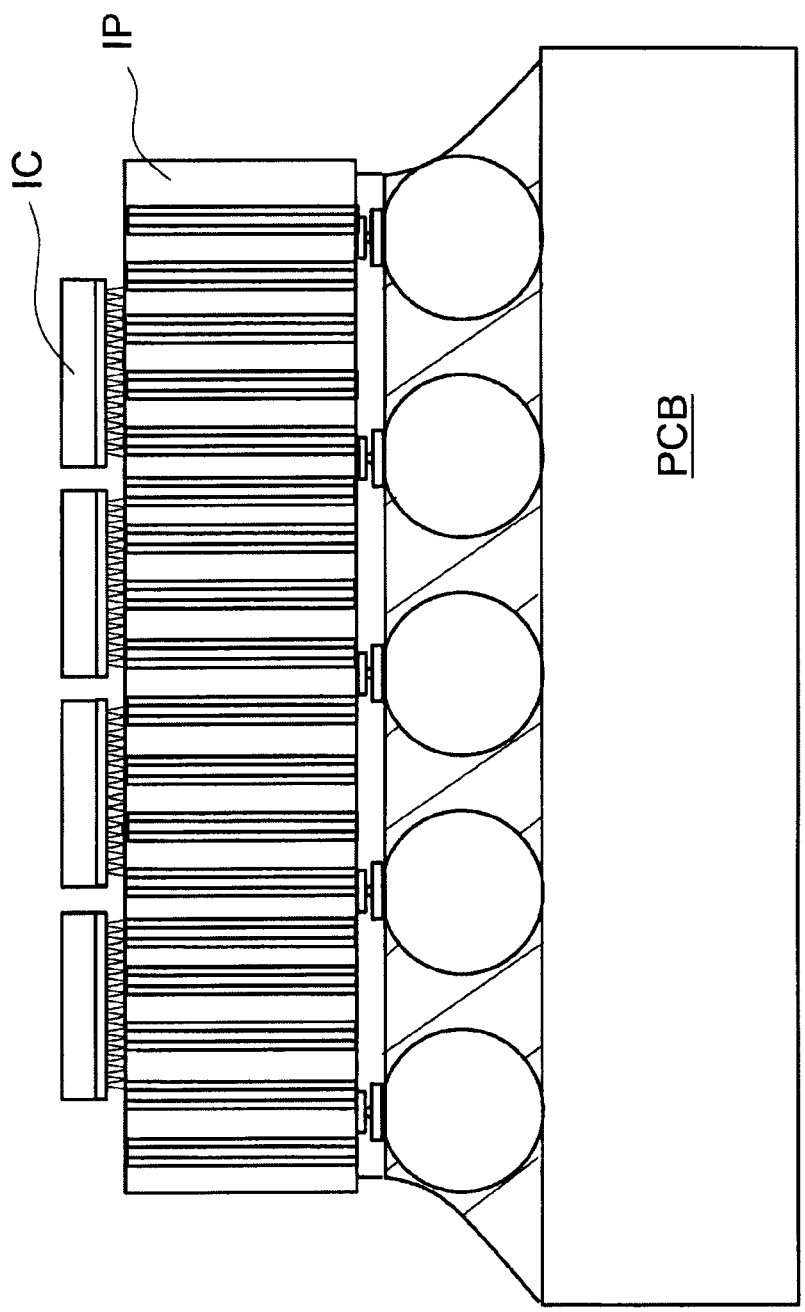
FIG. 5 shows schematically a structure according to the invention, i.e. one single rigid interposer that replaces the two components of the prior art, i.e. the glass/silicon interposer and the ball grid array.

FIG. 5 schematically illustrates the invention showing a plurality of integrated circuits IC on top of the interposer which is attached directly to a circuit board PCB. The interposer is one single, rigid component structure IP that replaces the multi-layered structure according to prior art (FIG. 4).

Figure 6:
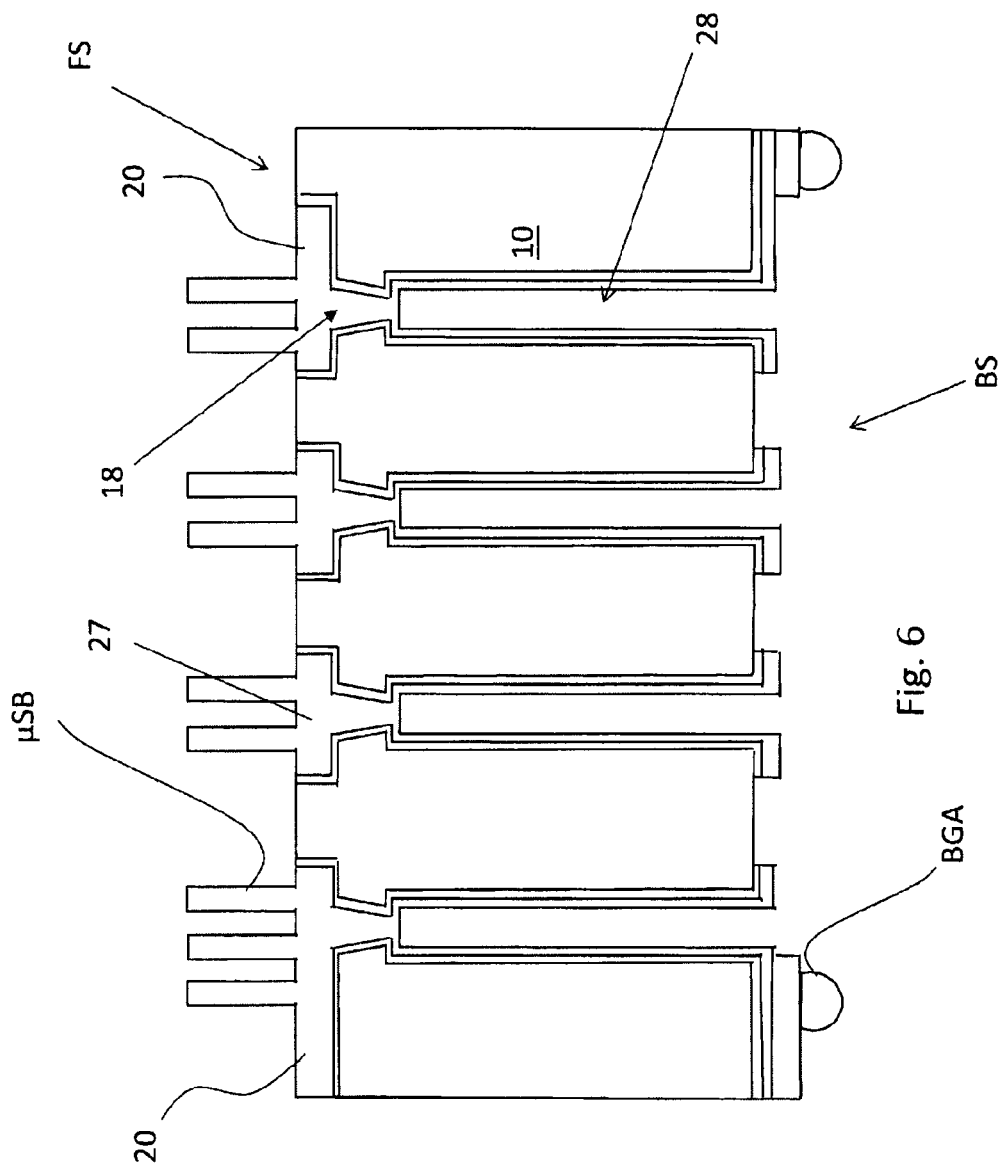
FIG. 6 illustrates the invention in more detail.

FIG. 6 illustrates an embodiment of an interposer in more detail. It comprises a substrate 10 in which double vias 18, 28 have been made. The double vias comprise a wide 28 and a narrow portion 18, and in the shown embodiment the narrow part is filled with metal 27 whereas the wider portion only has a "liner layer" of metal provided. There also is provided routing 20 on the front side FS, on which contact elements, suitably pillars µSB, are provided. These contact elements help in accommodating lateral movements due to thermal effects. On the back side BS there are further routing and contacts, e.g. Ball Grid Arrays BGA. Preferably the contact elements (pillars) are made of copper or at least are copper based.

Figure 7:
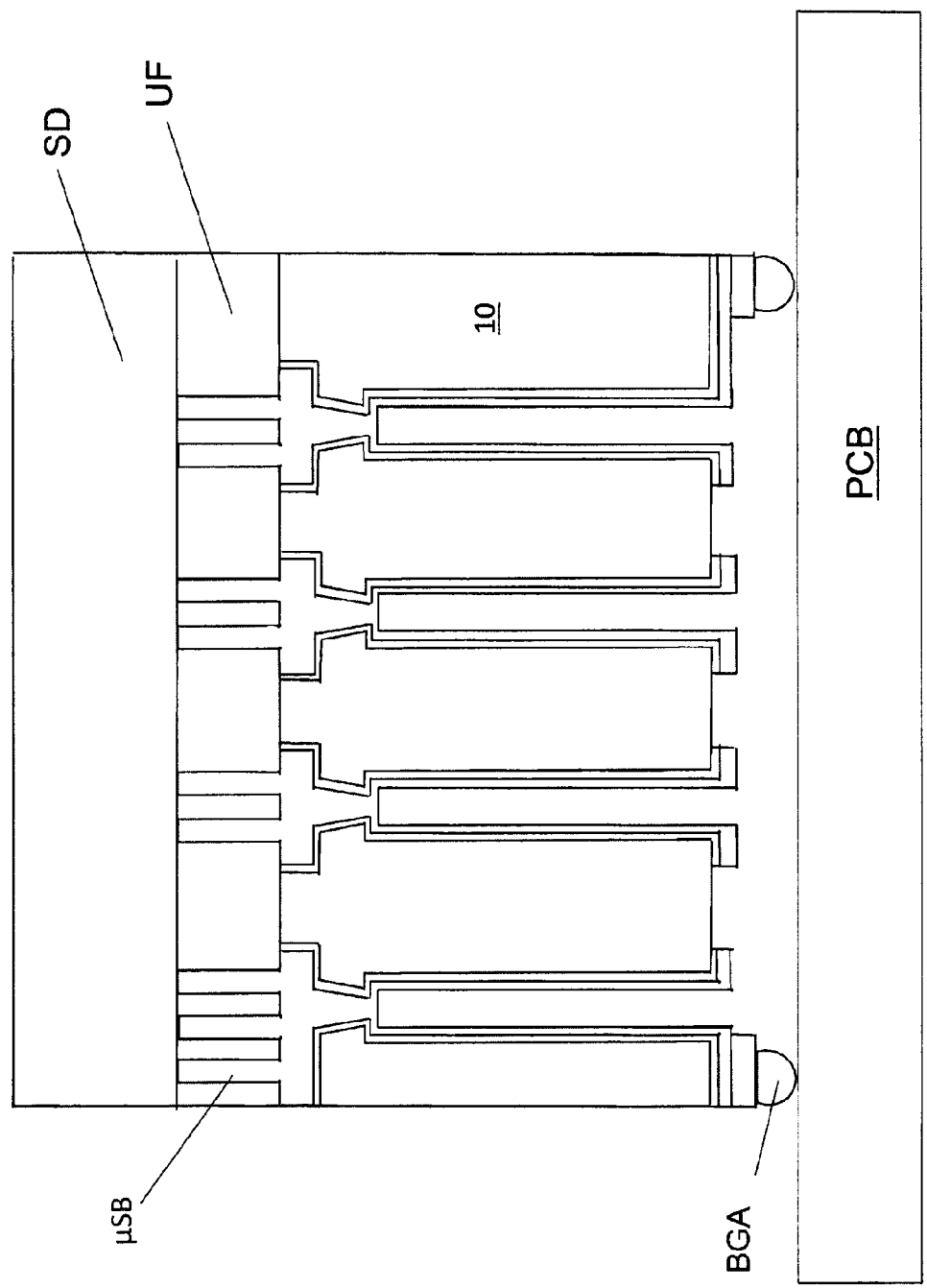
FIG. 7 illustrates an interposer mounted between a PCB and silicon device.

FIG. 7 illustrates an embodiment of an interposer according to the invention having the mentioned "double" vias and connecting a printed circuit board PCB with a silicon device SD on top, said device having a high density of I/O:s, i.e. very close spacing between them. On the bottom side the circuit board which can be a laminate, PCB, Ceramic etc with a low density of I/O:s, is attached.

These attached components have different CTE values and if attached directly to each other thermal effects would cause strains that might tear the components apart and render them non-functional. By virtue of the design of the via it is possible to adapt the metal amount so as to create a CTE value for the interposer as a whole that matches the differences in CTE of the components and thereby essentially eliminates the risk of thermal stress fractures.

As mentioned, on the top side of the interposer there can be provided contact elements in the form of contact elements pSB with a very small pitch (e.g. 50 µm spacing), or regular SMD solder µ-bumps.

The contact elements connect to the I/Os of the device on top, and by virtue of their small size and their aspect ratio (height/diameter=1:1 to 2:1) they will be able to accommodate any lateral movements caused by thermal influences, i.e. they will absorb any shear forces that may occur. The contact elements will exhibit dimensions of 20-50 µm in diameter and a height of 30-100 µm. A preferred diameter would be about 40 µm and a preferred height about 60 µm, giving an aspect ratio of 1.5:1. In order to further enhance the behaviour under-fill UF is also provided in conventional manner between the interposer and the silicon device on the top. In particular the underfill makes it possible to fine-tune the CTE matching by providing more or less underfill between the upper components.

The copper contact elements are made by Cu plating or other techniques well known to the skilled man in semiconductor packaging art.

However, it is also possible to use the methods disclosed in the mentioned co-pending applications to create thermal expansion matching structures, the sole purpose of which are to provide an adapted CTE value for the interposer.

Figure 8:
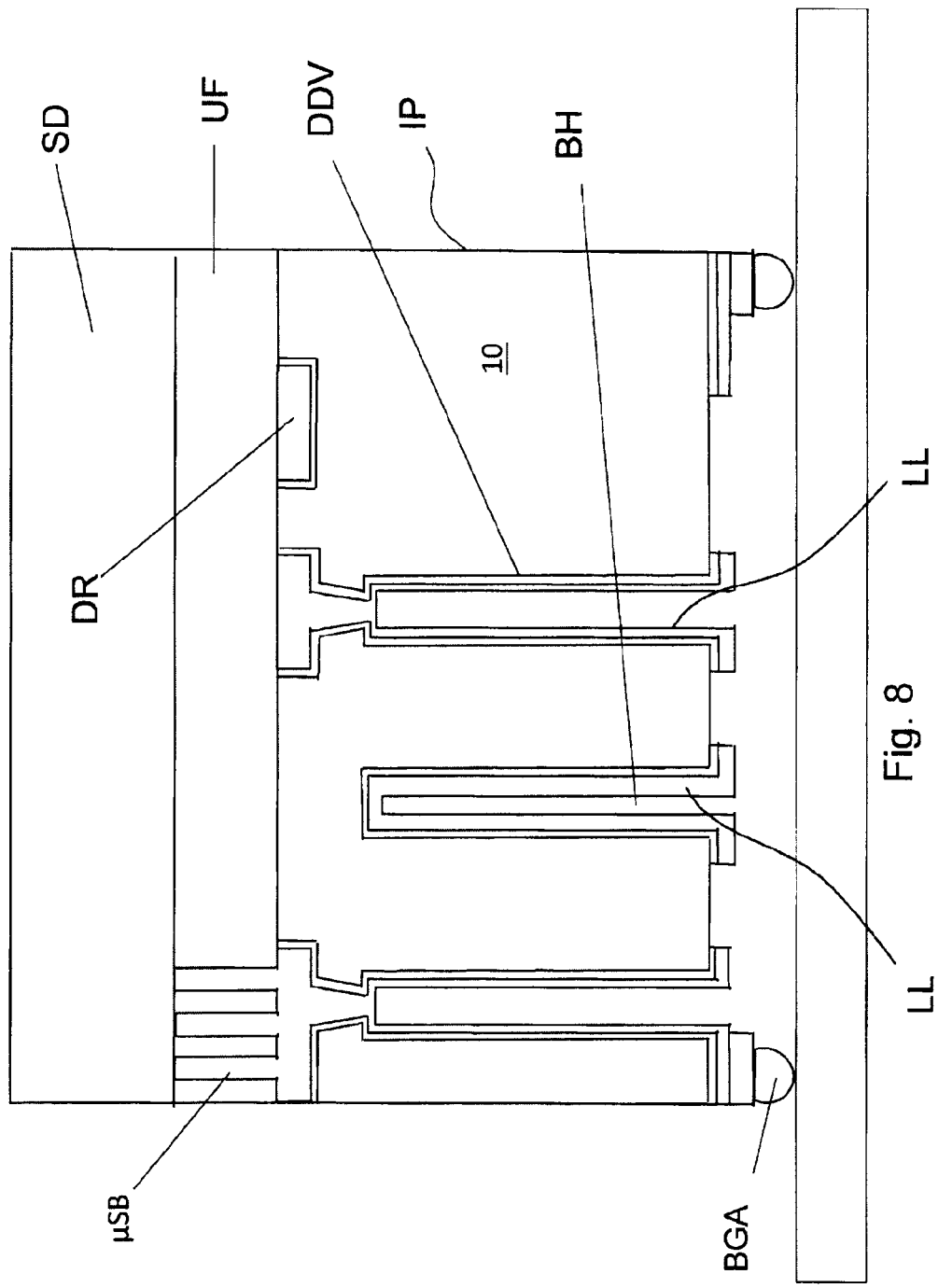
FIG. 8 illustrates an interposer in use having dedicated structures for CTE compensation.

Examples of such thermal expansion matching structures are shown in FIG. 8.

Thus, a first example is where the thermal expansion matching structure is provided as a double via DDV as shown previously, but where there are no connections to components, i.e. the via has an identical constitution as the "active" double vias but is not connected to any active components, and is thus only used for the purpose of introducing more metal in the interposer. In particular it is possible to provide thicker or thinner "liner layers" LL in the wider part of the double via, and thereby achieve even better adjustment of the CTE matching in the interposer structure. In FIG. 8 the thermal expansion matching structure has a relatively thin liner layer LL of metal.

An advantage with the liner vias as described above is that the substrate becomes more flexible in terms of ability to withstand stress.

A second example is where there is only provided a thermal expansion matching structure in the form of a recess DR in the front side (top surface as seen in the figure) and filling it with metal.

Finally, it is of course equally possible to provide only a thermal expansion matching structure from the back side, i.e. as a blind hole BH.

It should be noted that the shape and design of these thermal expansion matching structures can be varied within wide ranges. Thus, there could be provided a spiral shaped "recess" filled with some suitable material, or the recess could be a "truss" like shape.

This hole is a wider hole having only a liner LL on the inner walls. Here the liner layer is shown, as an example, with at thicker liner layer LL. In this case it is of course possible to provide thinner layers as well as to fill the via entirely, but the latter could lead to strains in the substrate, and is probably only usable in special circumstances.

The above process is usable for relatively thick substrates, i.e. exhibiting a thickness in the order of 300 µm and more, which is a rigid enough wafer to be compatible with automatic semiconductor handling without the need for stabilizing carrier solution.

Figure 9:
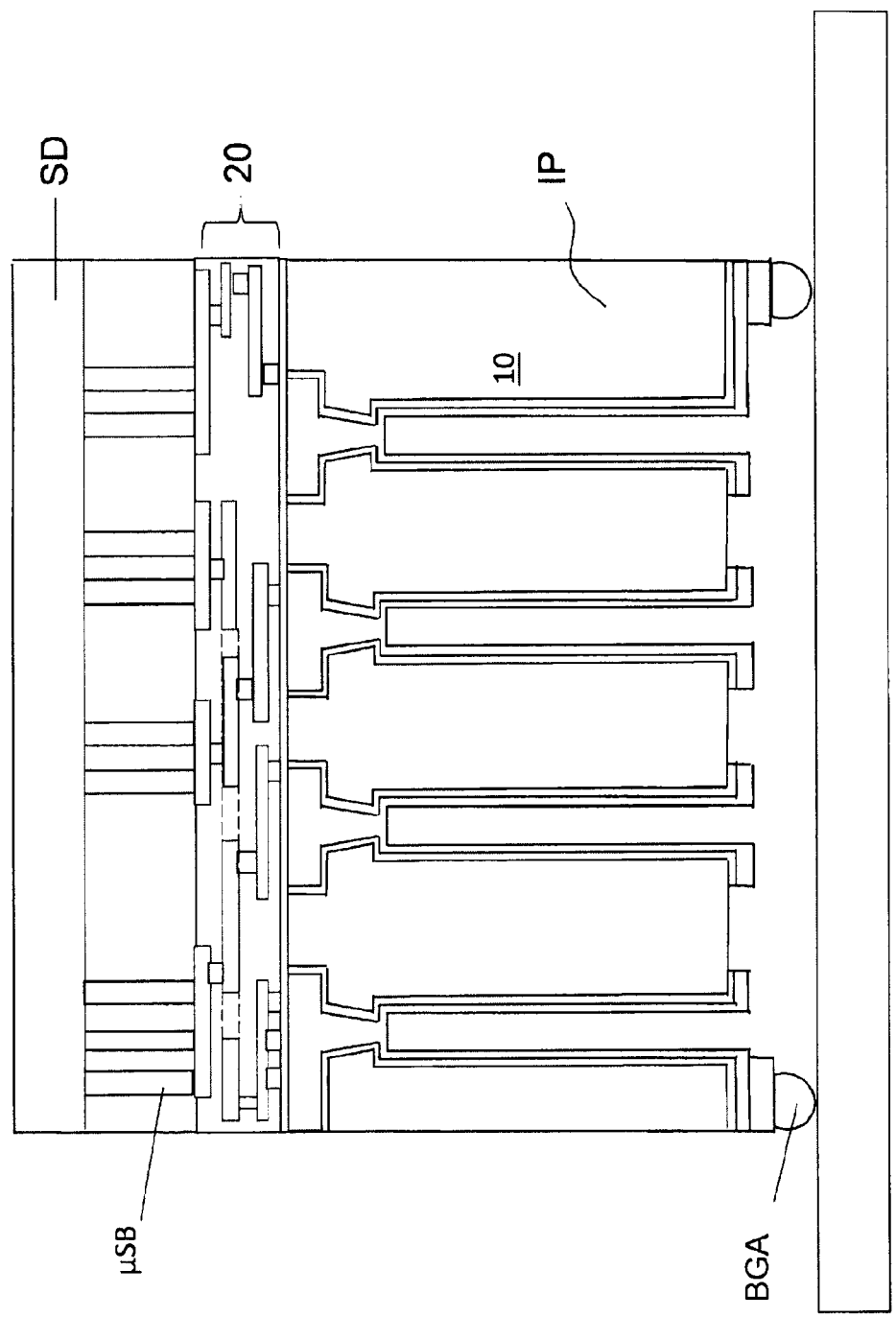
FIG. 9 illustrates an interposer provided with multiple Redistribution Layers (RDL)

FIG. 9 illustrates a further embodiment where the interposer IP has been provided with RDL structures 20 in several layers, suitably made by a damascene process. The material in which the actual routings (which are metal) are made is normally an insulator such as an oxide. Thus, this material in itself will exhibit a different CTE compared to the silicon in the interposer, and thus also this layered structure can also be made to provide some CTE matching.

Figure 10:
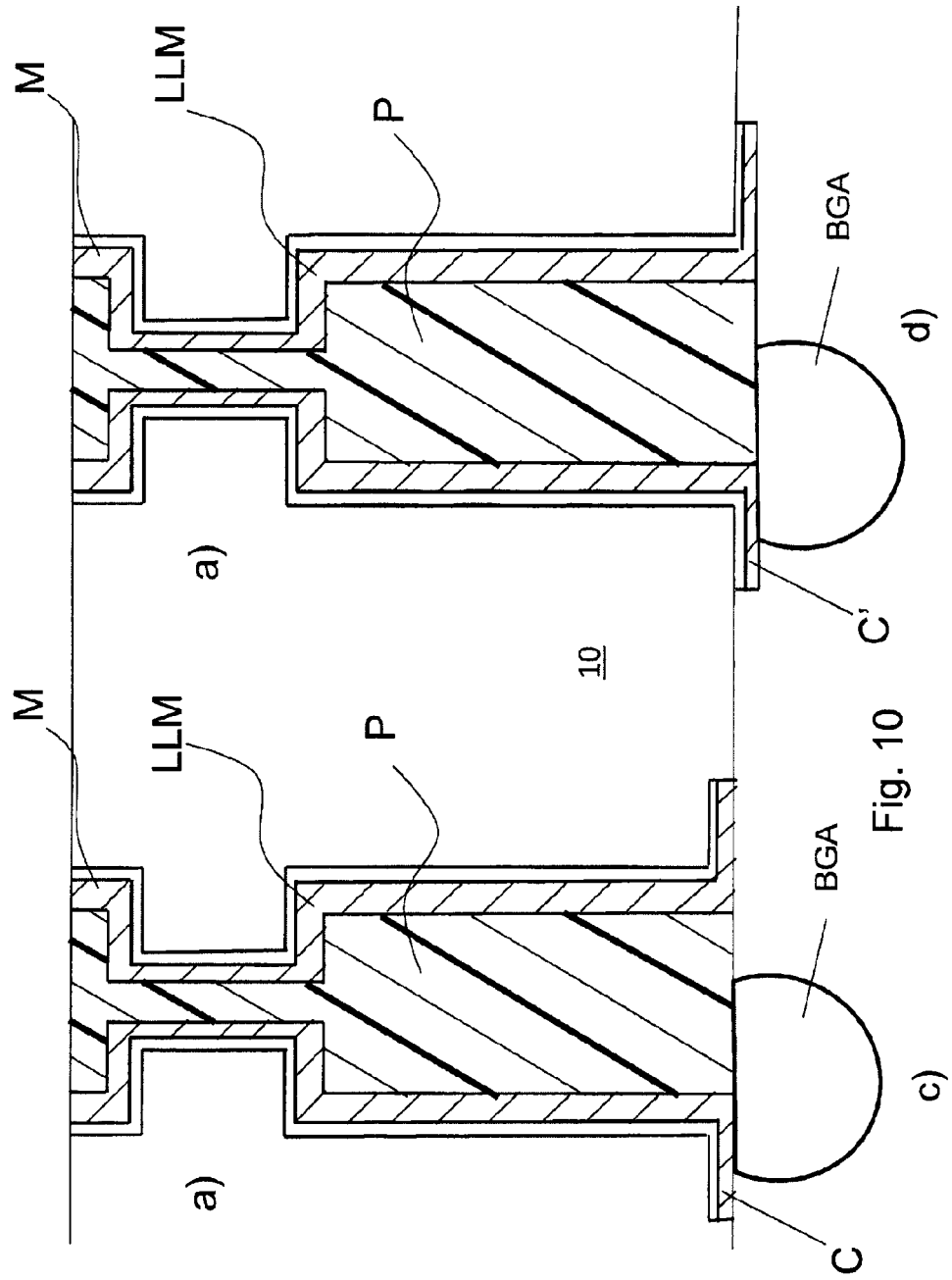
FIG. 10a-d shows further embodiments for providing CTE matching.

A further possibility to "fine tune" the CTE adjustment is illustrated in FIG. 10.

Namely, in a case where e.g. the via is not entirely filled with metal, the remaining voids can be filled with a further elastic material P having a different CTE than the metal. Such material can be e.g. an elastic polymer such as a siloxane based photosensitive permanent resist, obtainable e.g. from Shinetsu under the treadname SINR®, or off stoichmetric thiol-enes (OSTE), or low temperature poly-silicon. Poly-silicon is of course not elastic but has a suitable CTE value that yields a similar effect as the elastic polymers.

In FIG. 10a there is shown an example of a "double via", having a wide part and a narrow part, where there is a liner layer LLM only of metal covering the inner walls of the via, and the elastic further material P is provided so as to fill up the void.

In FIG. 10b the upper part of the structure, i.e. the narrow part of the via and, optionally if present, also the routing structure, is completely filled with metal M, whereas the lower, wider part only has a liner layer, and the void in the wider part is filled with the elastic further material P. This feature is of course applicable in all combinations of structures as described herein, although not explicitly shown.

One further advantage of providing a further material P as shown is that contact pads can be provided on the exposed surfaces of this material, which further improves the temperature matching.

However, for a structure such as the one shown in FIGS. 10a-b, the solder balls BGA should be slightly displaced from center such they cover the material in the liner layer only to one side, see FIG. 10a arrow at D. In this way any movement due to thermal stress will be accommodated by the combination of the solder ball and the elastic further material P provided in the via.

In FIG. 10c a collar C around the via is provided. In FIG. 10c the collar C is flush with the surrounding substrate 10 surface, and the solder ball BGA is attached partly to this collar C and partly supported by the further material P in the via. Thereby a better electrical contact is ascertained.

In FIG. 10d a collar C' is provided. However, in this case the collar is raised above the surrounding substrate surface.

These embodiments are in contrast to the embodiment shown in FIG. 6, where the solder balls BGA are provided entirely on the substrate. Here nay movements are entirely accommodated by the solder ball, which may cause it to shear to the extent that it breaks.

The invention claimed is:

1. Semiconductor interposer, comprising:
   a substrate of a semiconductor material having a first side and an opposite second side;
   at least one conductive wafer-through via comprising metal;
   at least one recess provided in the first side of the substrate and in the semiconductor material of the substrate, the recess being filled with metal and connected with the wafer-through via providing a routing structure; wherein
   the exposed surfaces of the metal filled via and the metal filled recess are essentially flush with the substrate surface on the first side of the substrate; wherein
   the wafer-through via comprises a narrow part and a wider part;
   there are provided contact elements on said routing structure having an aspect ratio, height:diameter, <1:1, preferably 1:1 to 2:1; and wherein
   there is a plurality of vias and recesses forming electrical connections between said first and second structures attached to the first and second sides of the interposer, respectively, and a plurality of vias and recesses which are provided for the purpose of adapting the overall coefficient of thermal expansion of the interposer to said value between the values of the first and the second structure, respectively.

2. The interposer according to claim 1, wherein the overall coefficient of thermal expansion of the interposer as a whole has a value in between i) the value of the coefficient of thermal expansion of a first structure having a low coefficient of thermal expansion and which is to be attached to the first side of the interposer, and ii) the value of coefficient of thermal expansion of a second structure having a high coefficient of thermal expansion and which is to be attached to the second side of the interposer.

3. The interposer according to claim 1, wherein the said contact elements are pillars, preferably copper based solder pillars.

4. The interposer according to claim 1, wherein the height of the contact elements is 30-100 μm and the diameter is 20-50 μm.

5. The interposer according to claim 1, further comprising thermal expansion matching structure entirely or partly filled with metal.

6. The interposer according to claim 5, wherein the interposer comprises thermal expansion matching structure having only a wide part extending only over a fraction of the thickness of the substrate.

7. The interposer according to claim 5, wherein a thermal expansion matching structure comprises only a narrow part, filled with metal, and extending only over a fraction of the thickness of the substrate.

8. The interposer according to claim 5, wherein a thermal expansion matching structure comprises both a wide and a narrow part, wherein the narrow part is completely filled with metal and the wide part is at least provided with a liner layer of metal.

9. The interposer according to claim 1, wherein a via is only partly filled with metal and further comprises a further material selected from polymer, and poly-silicon.

10. The interposer according to claim 9, wherein the polymer is selected from siloxane based photosensitive permanent resist and off stoichmetric thiol-enes.

11. The interposer according to claim 9, wherein there are provided solder balls (BGA) on the back side of the interposer, slightly displaced from the center of a via such they cover the material in the liner layer only to one side.

12. The interposer according to claim 9, wherein a collar (C) around the via is provided on the back side, said collar being flush with the surrounding substrate (10) surface, and wherein the solder ball BGA is attached partly to this collar (C) and partly supported by the further material P in the via.

13. The interposer according to claim 9, wherein a collar around the via is provided on the back side, said collar being raised above the surrounding substrate surface.

14. Semiconductor product comprising:
   an interposer according to claim 1;
   a first structure having a low coefficient of thermal expansion and which is attached to the first side of the interposer; and
   a second structure having a high coefficient of thermal expansion and which is attached to the second side of the interposer.

15. The product according to claim 14, wherein said first structure is a silicon based integrated circuit; and wherein said second structure is a circuit board.

16. The product according to claim 14, wherein there is provided underfill between the interposer and the silicon device on the top.

17. A method of making an interposer, comprising providing a substrate having a front side and a back side; making a double via having a narrow part and a wide part; depositing metal at least as a liner layer inside the via on its walls; providing redistribution structures in the surface(s) of the substrate which are flush with at least the front side of the substrate; making contact elements on the redistribution structures on the front side, said contact elements having an aspect ratio, height:diameter <1:1, preferably 1:1 to 2:1.

18. The method according to claim 17, wherein an elastic polymer or poly-silicon is deposited in the voids in the via.

* * * * *